United States Patent [19]

Rodé et al.

[11] 3,955,074

[45] May 4, 1976

[54] GENERAL PURPOSE CALCULATOR HAVING KEYS WITH MORE THAN ONE FUNCTION ASSIGNED THERETO

[75] Inventors: Francé Rodé, Los Altos; William L. Crowley, Jr., Cupertino; Alexander D. R. Walker, San Francisco, all of Calif.

[73] Assignee: Hewlett-Packard Company, Palo Alto, Calif.

[22] Filed: Oct. 10, 1974

[21] Appl. No.: 513,801

Related U.S. Application Data

[62] Division of Ser. No. 302,371, Oct. 30, 1972, Pat. No. 3,863,060.

[52] U.S. Cl. .............................. 235/156; 235/145 R
[51] Int. Cl.² ............................................. G06F 3/02
[58] Field of Search ........... 235/156, 159, 160, 164, 235/168, 145 R; 340/172.5

[56] References Cited

UNITED STATES PATENTS

| | | | |
|---|---|---|---|
| 3,381,276 | 4/1968 | James | 235/145 R |
| 3,597,600 | 8/1971 | Herendeen et al. | 235/156 |
| 3,757,097 | 9/1973 | Kuijsten | 235/159 |
| 3,781,820 | 12/1973 | Cochran et al. | 340/172.5 |
| 3,797,630 | 3/1974 | Zilkha | 235/145 R |

*Primary Examiner*—David H. Malzahn
*Attorney, Agent, or Firm*—F. David LaRiviere

[57] ABSTRACT

A battery-powered, hand-held calculator employs MOS/LSI calculator circuits to perform arithmetic and financial calculations. Data and commands are input to the calculator from a keyboard having a prefix key to double the functions of selected keys. A 15-digit, seven-segment light emitting diode (LED) display serves as the output for the calculator.

15 Claims, 1 Drawing Figure

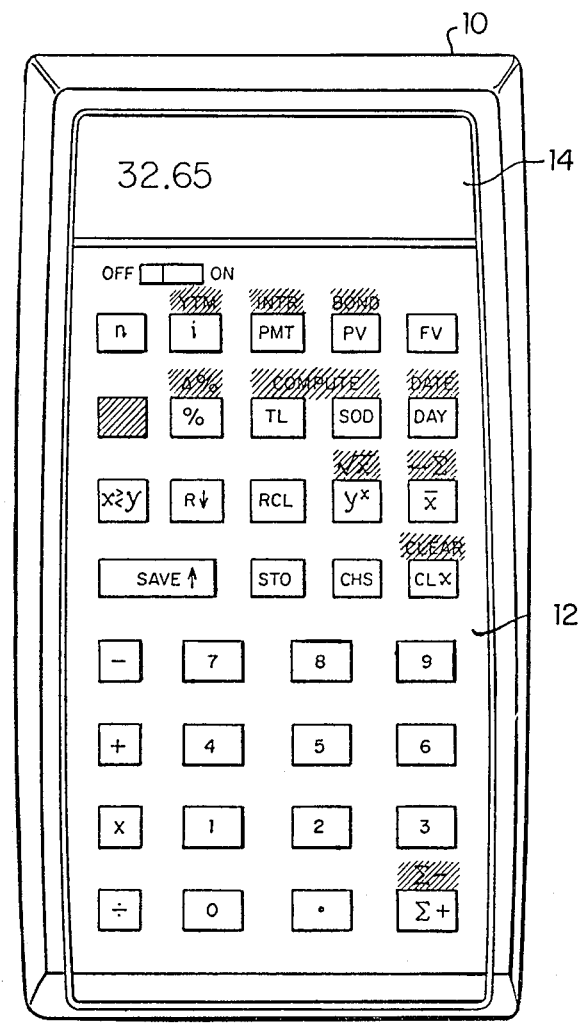

GENERAL PURPOSE CALCULATOR HAVING KEYS WITH MORE THAN ONE FUNCTION ASSIGNED THERETO

CROSS-REFERENCE TO RELATED APPLICATION

This application is a division of allowed U.S. patent Application Ser. No. 302,371 entitled "General Purpose Calculator with Capability for Performing Interdisciplinary Business Calculations", filed by France Rode, et al. on Oct. 30, 1972, which is not U.S. Pat. 3,863,060 and is hereby incorporated by reference as amended as if fully set forth herein.

BACKGROUND AND SUMMARY OF THE INVENTION

This invention relates generally to calculators and improvements therein and more particularly to non-programmable business calculators.

A calculator constructed according to the preferred embodiment of this invention is small enough to hold in one hand, capable of displaying data as it is entered and a numerical result as it is calculated, and incorporates many complex functions in order to perform the number and kind of calculations and mathematical operations required for different business disciplines. The limits of miniaturization and sophistication are realized, however, if the keyboard of such a calculator becomes so small and so crowded with keys that the human hand can no longer physically or conveniently manipulate them. One solution to this problem is to reduce the number of functions the calculator can perform. A better solution is to assign more than one function to each key, thus reducing the number of keys necessary to incorporate all the functional capabilities of the calculator.

Conventional business calculators generally have less capability and flexibility than is required to meet the needs of the business user. Many business calculators are designed for special applicaions by specialists in that area, and the keyboards are generally not self-explanatory, appearing as a befuddling collection of buttons and switches with special symbols. This requires a longer user orientation period before productive use beings. Moreover, as more functions are assigned to each key, unclear labelling of a key's various functions only further confuses the new user. Not only must the labelling clearly refer to the particular key, but the functions each key causes the machine to perform should be easily understood and learned by the user from scanning the keyboard legends. After learning the total capability of the particular machine from a reading of the manual, the user should be able to know the relationship between keys, the function(s) each key initiates and, therefore, the operation of the machine, from his knowledge of the keyboard itself.

The limitations of miniature calculators are overcome in the preferred embodiment of the present invention by incorporating easily interpreted, coded legends on the surface of the keyboard immediately above certain keys to which an additional function is assigned. The coding, not only designates the additional function of each such key, but also refers to a prefix key which is depressed to activate the additional function of the key.

In addition to providing easily manipulated, clearly labelled keys, the preferred embodiment of this invention provides a small business calculator which does not require a high level of user expertise or a working knowledge of the problem area and the necessary mathematical formulas before the problem can be set up and solved. Keys relating to a general class of problems are grouped together and designated in accordance with the generally accepted business symbols (e.g., $i$ for interest per period, "PMT" for payment per period, etc.). The key layout and the keying sequence are such that they suggest to the non-expert user the information necessary to solve a given problem. For example, in solving the general class of compound interest and annuity problems with this calculator, the five possible variables, number of time periods, interest rate per period, payment per period, the present value and the future value are all located on the top row. A user can key in any of the three variables in the prescribed left to right sequence and the calculator will solve either of the remaining unknowns as requested. This procedure does not require any previous knowledge of compound interest or annuity mathematics, and any of the five variables can be solved without any intermediate steps. Hence, all that is required of the user is that he be able to define the variables of the problem, and the unique keying sequence of the invention will carry out the necessary mathematical manipulation. Description of the Drawing The drawing is a top view of a calculator according to the preferred embodiment of the invention.

We claim:

1. An electronic calculator comprising:
   keyboard input means for entering information into the calculator;
   storage means, coupled to said keyboard input means, for storing information entered into the calculator;
   processing means, coupled to said keyboard input means and said storage means, for processing information entered into the calculator and stored in said storage means to perform selected calculations; and
   output means, coupled to said processing means, for displaying the results of selected calculations performed by said processing means;
   said keyboard input means including a plurality of input keys manually operable for causing said processing means to perform a first plurality of operations designated by a first plurality of legends positioned on said keyboard input means and associated with said plurality of input keys;
   said keyboard input means further including a command key manually operable with said plurality of input keys for conditioning said processing means to perform any one of a second plurality of operations designated by one of a second plurality of legends positioned on said keyboard input means and associated with said plurality of input keys;
   said command key and said second plurality of legends being coded to associate said command key with each of said second plurality of operations designated by said second plurality of legends.

2. An electronic calculator as in claim 1 wherein said processing means is conditioned to perform any one of said second plurality of operations by actuation of the corresponding one of said plurality of input keys subsequent to actuation of said command key.

3. An electronic calculator as in claim 1 wherein:
   said keyboard input means includes numeric keys for entering numerical information into the calculator, and function keys for controlling the calculations performed by the calculator; and each of said plurality of input keys comprises a different one of said function keys.

4. An electronic calculator as in claim 1 wherein said command key and said second plurality of legends are coded by color.

5. An electronic calculator as in claim 4 wherein the body of said command key and the characters of said second plurality of legends are the same color.

6. An electronic calculator as in claim 5 wherein said processing means is conditioned to perform any one of said second plurality of operations by actuation of the corresponding one of said plurality of input keys subsequent to actuation of said command key.

7. An electronic calculator as in claim 6 wherein:
said keyboard input means includes numeric keys for entering numerical information into the calculator, and function keys for controlling the calculations performed by the calculator; and each of said plurality of input keys comprises a different one of said function keys.

8. An electronic calculator as in claim 1 wherein said command key and said second plurality of legends are coded by the positions of said second plurality of legends on said keyboard input means.

9. An electronic calculator as in claim 8 wherein:
each of said first plurality of legends is positioned on a different one of said plurality of input keys; and each of said second plurality of legends is positioned on a panel of said keyboard input means adjacent to an associated different one of said plurality of input keys.

10. An electronic calculator as in claim 9 wherein said processing means is conditioned to perform any one of said second plurality of operations by actuation of the corresponding one of said plurality of input keys subsequent to actuation of said command key.

11. An electronic calculator as in claim 10 wherein:
said keyboard input means includes numeric keys for entering numerical information into the calculator, and function keys for controlling the calculations performed by the calculator; and each of said plurality of input keys comprises a different one of said function keys.

12. An electronic calculator as in claim 9 wherein said command key and said second plurality of legends are coded by color.

13. An electronic calculator as in claim 12 wherein the body of said command key and the characters of said second plurality of legends are the same color.

14. An electronic calculator as in claim 13 wherein said processing means is conditioned to perform any one of said second plurality of operations by actuation of the corresponding one of said plurality of input keys subsequent to actuation of said command key.

15. An electronic calculator as in claim 14 wherein:
said keyboard input means includes numeric keys for entering numerical information into the calculator, and function keys for controlling the calculations performed by the calculator; and each of said plurality of input keys comprises a different one of said function keys.

* * * * *